(12) United States Patent
Wang et al.

(10) Patent No.: US 9,852,952 B2
(45) Date of Patent: Dec. 26, 2017

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chih-Chung Wang, Hsinchu (TW);
Shih-Yin Hsiao, Chiayi County (TW);
Wen-Fang Lee, Hsinchu (TW);
Nien-Chung Li, Hsinchu (TW);
Shu-Wen Lin, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/925,955

(22) Filed: Oct. 28, 2015

(65) Prior Publication Data

US 2017/0125297 A1 May 4, 2017

(51) Int. Cl.
| | |
|---|---|
| *H01L 21/8234* | (2006.01) |
| *H01L 21/28* | (2006.01) |
| *H01L 29/66* | (2006.01) |
| *H01L 21/3105* | (2006.01) |
| *H01L 21/3213* | (2006.01) |
| *H01L 21/321* | (2006.01) |
| *H01L 29/49* | (2006.01) |
| *H01L 29/06* | (2006.01) |
| *H01L 27/088* | (2006.01) |

(52) U.S. Cl.
CPC .. *H01L 21/82345* (2013.01); *H01L 21/28035* (2013.01); *H01L 21/31051* (2013.01); *H01L 21/32115* (2013.01); *H01L 21/32139* (2013.01); *H01L 27/088* (2013.01); *H01L 29/0653* (2013.01); *H01L 29/4916* (2013.01); *H01L 29/66545* (2013.01)

(58) Field of Classification Search
None
See application file for complete search history.

(56) References Cited

U.S. PATENT DOCUMENTS

| 6,140,688 A | 10/2000 | Gardner et al. |
|---|---|---|
| 6,406,956 B1 | 6/2002 | Tsai et al. |
| 8,003,461 B1 | 8/2011 | Hsu et al. |
| 2013/0049168 A1* | 2/2013 | Yang ........................ H01L 28/20 257/538 |
| 2015/0069525 A1* | 3/2015 | Adams .................. H01L 21/845 257/392 |
| 2016/0028009 A1* | 1/2016 | Tan .......................... H01L 45/16 257/2 |

\* cited by examiner

*Primary Examiner* — Alexander Ghyka
(74) *Attorney, Agent, or Firm* — Winston Hsu

(57) ABSTRACT

A method for fabricating semiconductor device is disclosed. The method includes the steps of: providing a substrate having a logic region and high-voltage (HV) region; forming a first gate structure on the logic region and a second gate structure on the HV region; forming an interlayer dielectric (ILD) layer around the first gate structure and the second gate structure; forming a patterned hard mask on the HV region; and transforming the first gate structure into a metal gate.

6 Claims, 4 Drawing Sheets

SEMICONDUCTOR DEVICE AND METHOD FOR FABRICATING THE SAME

BACKGROUND OF THE INVENTION

1. Field of the Invention

The invention relates to a high-k metal gate process, and more particularly, to a method of integrating high-k metal gates with high-voltage device.

2. Description of the Prior Art

In current semiconductor industry, polysilicon has been widely used as a gate material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, in current fabrication of high-k metal gate transistor, as gate dielectric layer on high-voltage region typically protrudes from the substrate surface, the metal gate formed on high-voltage region afterwards also becomes higher than the metal gate formed on low-voltage region. Consequently, a large portion of the metal gate on high-voltage region is lost by chemical mechanical polishing (CMP) process conducted thereafter. Hence, how to resolve this issue has become an important task in this field.

SUMMARY OF THE INVENTION

According to a preferred embodiment of the present invention, a method for fabricating semiconductor device is disclosed. The method includes the steps of: providing a substrate having a logic region and high-voltage (HV) region; forming a first gate structure on the logic region and a second gate structure on the HV region; forming an interlayer dielectric (ILD) layer around the first gate structure and the second gate structure; forming a patterned hard mask on the HV region; and transforming the first gate structure into a metal gate.

According to another aspect of the present invention, a semiconductor device is disclosed. The semiconductor device includes: a substrate having a logic region and a high-voltage (HV) region; and a first gate structure on the logic region and a second gate structure on the HV region, in which the first gate structure comprises a metal gate and the second gate structure comprises polysilicon.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
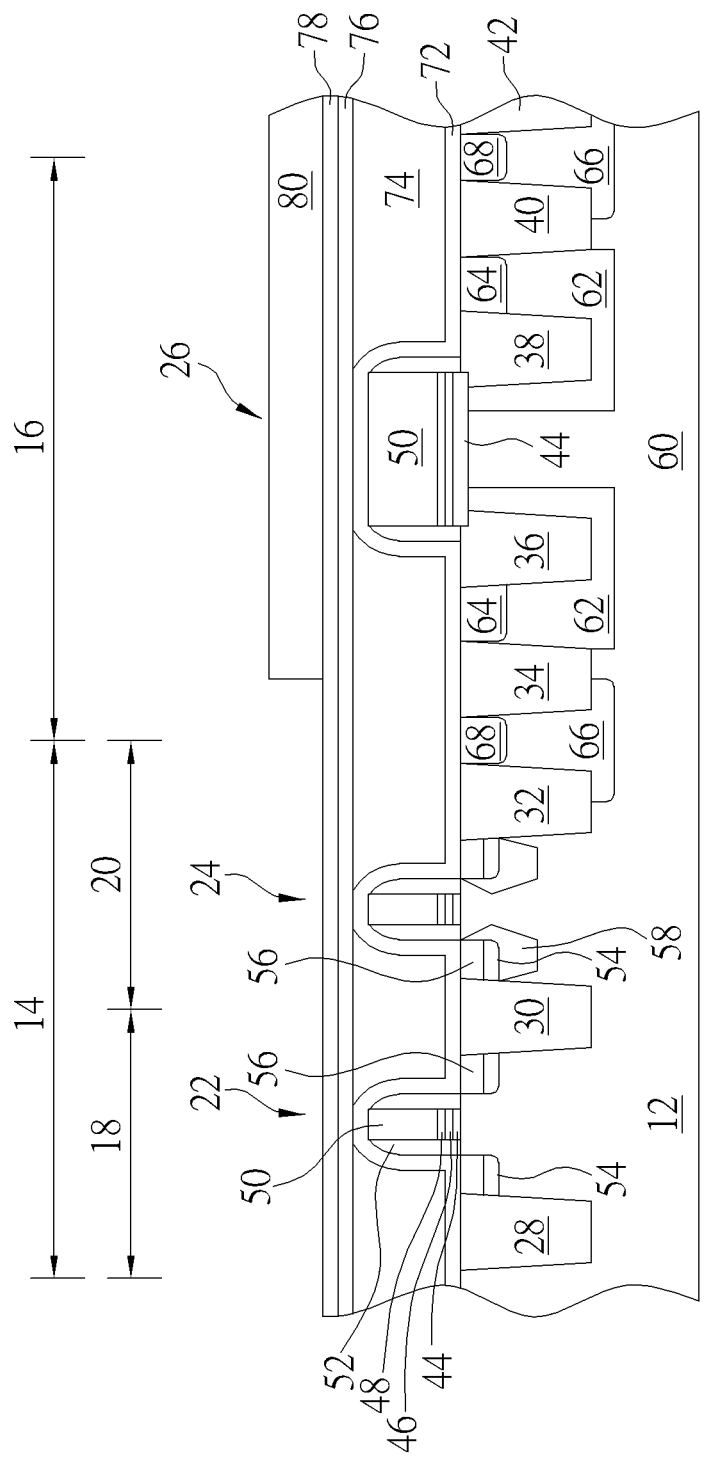
FIG. 1 illustrates a method for fabricating a semiconductor device according to an embodiment of the present invention.

Referring to FIGS. 1-4, FIGS. 1-4 illustrate a method for fabricating semiconductor device according to a preferred embodiment of the present invention. As shown in FIG. 1, a substrate 12, such as a silicon substrate or silicon-on-insulator (SOI) substrate is provided, and a logic region 14 and a high-voltage (HV) region 16 are defined on the substrate 12. In this embodiment, the logic region 14 further includes a NMOS region 18 and a PMOS region 20, but could also be adjusted to having only a single NMOS region or a PMOS region depending on the demand of the product. A plurality of gate structures 22, 24, 26 are formed on the logic region 14 and HV region 16 respectively and shallow trench isolations (STIs) 28, 30, 32, 34, 36, 38, 40, 42 are formed in the substrate 12 to separate the logic region 14 and HV region 16 and under part of the gate structure 26 on HV region 16.

The fabrication of the gate structures 22, 24, 26 could be accomplished by a gate first process, a high-k first approach from gate last process, or a high-k last approach from gate last process. In this embodiment, a high-k first approach is employed to form gate structures 22, 24, 26 on the logic region 14 and the HV region 16, in which each of the gate structures 22, 24, 26 includes an interfacial layer or gate dielectric layer 44, a high-k dielectric layer 46, a bottom barrier metal (BBM) layer 48, and a gate electrode 50 composed of polysilicon material. A spacer 52 is then formed adjacent to each of the gate structures 22, 24, 26.

In this embodiment, the gate dielectric layer 44 is preferably composed of oxides such as $SiO_2$ or SiON, but could also be composed of high-k dielectric material. The BBM layer 48 is selected from the material consisting of TiN and TaN, but not limited thereto.

The high-k dielectric layer 46 is preferably selected from dielectric materials having dielectric constant (k value) larger than 4. For instance, the high-k dielectric layer 46 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In addition to the gate structures 22, 24, 26 and spacers 52, a source/drain region 54 and a silicide layer 56 is formed in the substrate 12 adjacent to two sides of the spacers 52 on NMOS region 18, and an epitaxial layer 58, another source/drain region 54, and another silicide layer 56 are formed in the substrate 12 adjacent to two sides of the spacer 52 on PMOS region 20. On the HV region 16, a p-well 60 is formed in the substrate 12, STIs 36, 38 are formed in the p-well 60 and substrate 12 and under part of the gate structure 26, n-type regions 62 are formed in the p-well 60 and/or substrate 12 under the gate structure 26 and the STIs 36, 38, n+ regions 64 are formed in the n-type regions 62 and between STIs 36, 38 and STIs 34, 40, p-type regions 66 are formed between STIs 34, 40 and STIs 32, 42, and p+ regions 68 are formed in the p-type regions 66 and between STIs 32 and 34 and STIs 40 and 42.

Next, a contact etch stop layer (CESL) 72 is formed on the substrate 12 and covering the gate structures 22, 24, 26, an interlayer dielectric (ILD) layer 74 is formed on the CESL 72, and a planarizing process such as chemical mechanical polishing (CMP) process is conducted to remove part of the ILD layer 74 and stop on the CESL 72 so that the top surfaces of the ILD layer 74 and CESL 72 are coplanar. In this embodiment, the CESL 72 is composed of silicon nitride and the ILD layer 74 is composed of oxides such as tetraethyl orthosilicate (TEOS), but not limited thereto.

Next, a buffer layer 76 and a cap layer 78 are deposited on the ILD layer 74 and the CESL 72, and a patterned mask 80 such as patterned resist is formed on the cap layer 78 of the HV region 16. In this embodiment, the buffer layer 76 is selected from the group consisting of silicon nitride and titanium nitride and the cap layer 78 is composed of silicon oxide, but not limited thereto.

Figure 2:
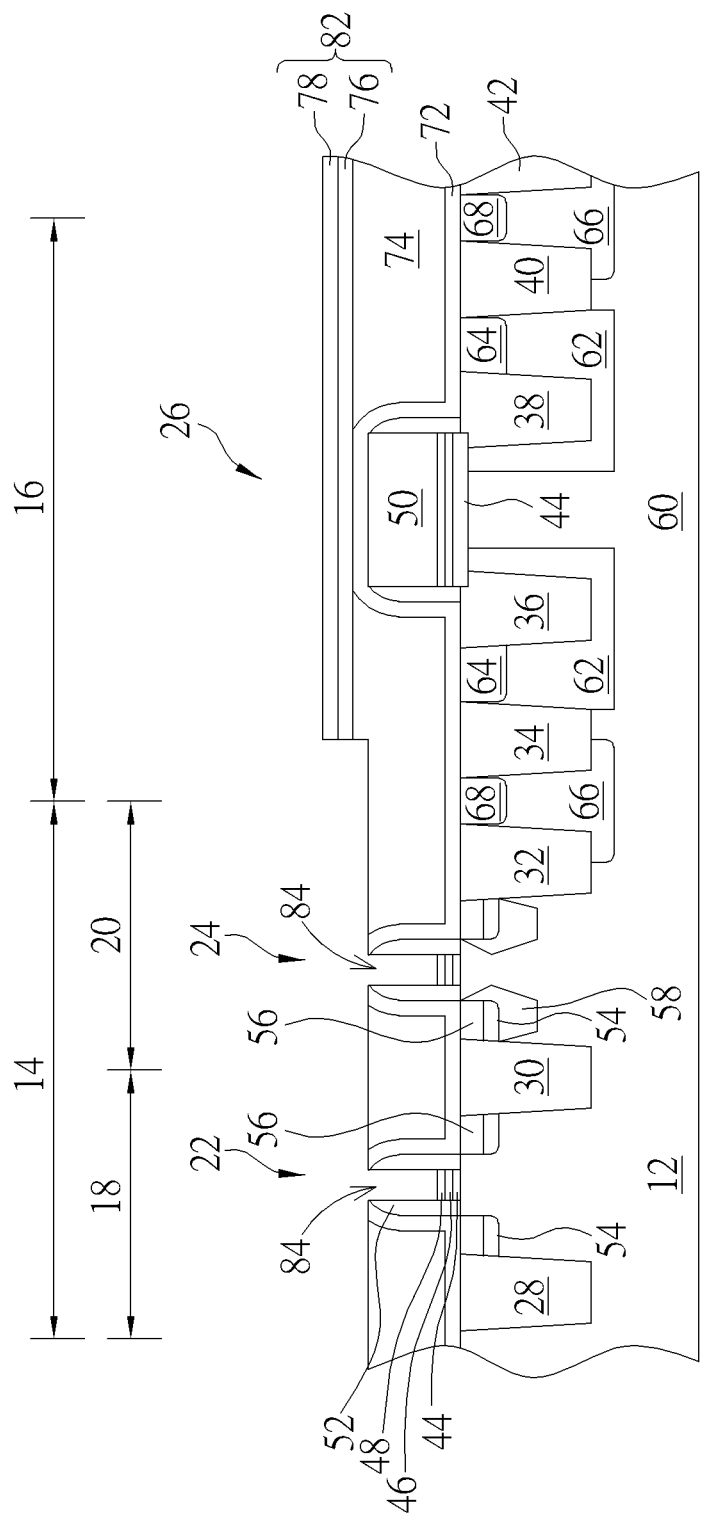
FIG. 2 illustrates a process for fabricating a semiconductor device following FIG. 1.

Next, as shown in FIG. 2, an etching process is conducted by using the patterned resist 80 as mask to remove or pattern part of the cap layer 78 and part of the buffer layer 76 on the logic region 14 for forming a patterned hard mask 82 on the HV region 16. The patterned resist 80 is stripped thereafter. Next, another etching process is conducted by using the patterned hard mask 82 as mask to remove the CESL 72 on the gate structures 22 and 24 and even part of the ILD layer 74, and yet another etching process is conducted to remove the gate electrodes 50 from NMOS region 18 and PMOS region 20. This forms recesses 84 in the NMOS region 18 and PMOS region 20 respectively and exposes the BBM layer 48 underneath. It should be noted that due to the protection of the patterned hard mask 82, the gate electrode 50 composed of polysilicon material on the HV region 16 is unaffected by the aforementioned etching processes and the gate structure 26 still remains as a polysilicon gate on the HV region 16 after the formation of the recesses 84.

Alternatively, according another embodiment of the present invention, instead of patterning the aforementioned buffer layer 76 and cap layer 78 to form the patterned hard mask 82, it would also be desirable to omit the step of forming the buffer layer 76 and cap layer 78 on the HV region 16 and form a patterned resist such as patterned resist 80 on the HV region 16 directly and use the patterned resist as a patterned hard mask to remove the CESL 72 and gate electrodes 50 on the logic region 14, and strip the patterned resist thereafter, which is also within the scope of the present invention.

In addition, according to an embodiment of the present invention, it would also be desirable to first form hard masks (not shown) selected from the group consisting of silicon nitride and silicon oxide on each of the gate electrodes 50 on logic region 14 and HV region 16, form the CESL 72 and ILD layer 74 on gate structures 22, 24, 26 having the hard masks, planarize the ILD layer 74 and CESL 72 to expose the hard masks, and form the patterned hard mask 82 consisting of buffer layer 76 and cap layer 78 revealed in FIG. 2 on the HV region 16. The patterned hard mask 82 could then be used to remove the hard masks and polysilicon gate electrodes 50 from NMOS region 18 and PMOS region 20 to form recesses 84, which is also within the scope of the present invention.

Figure 3:
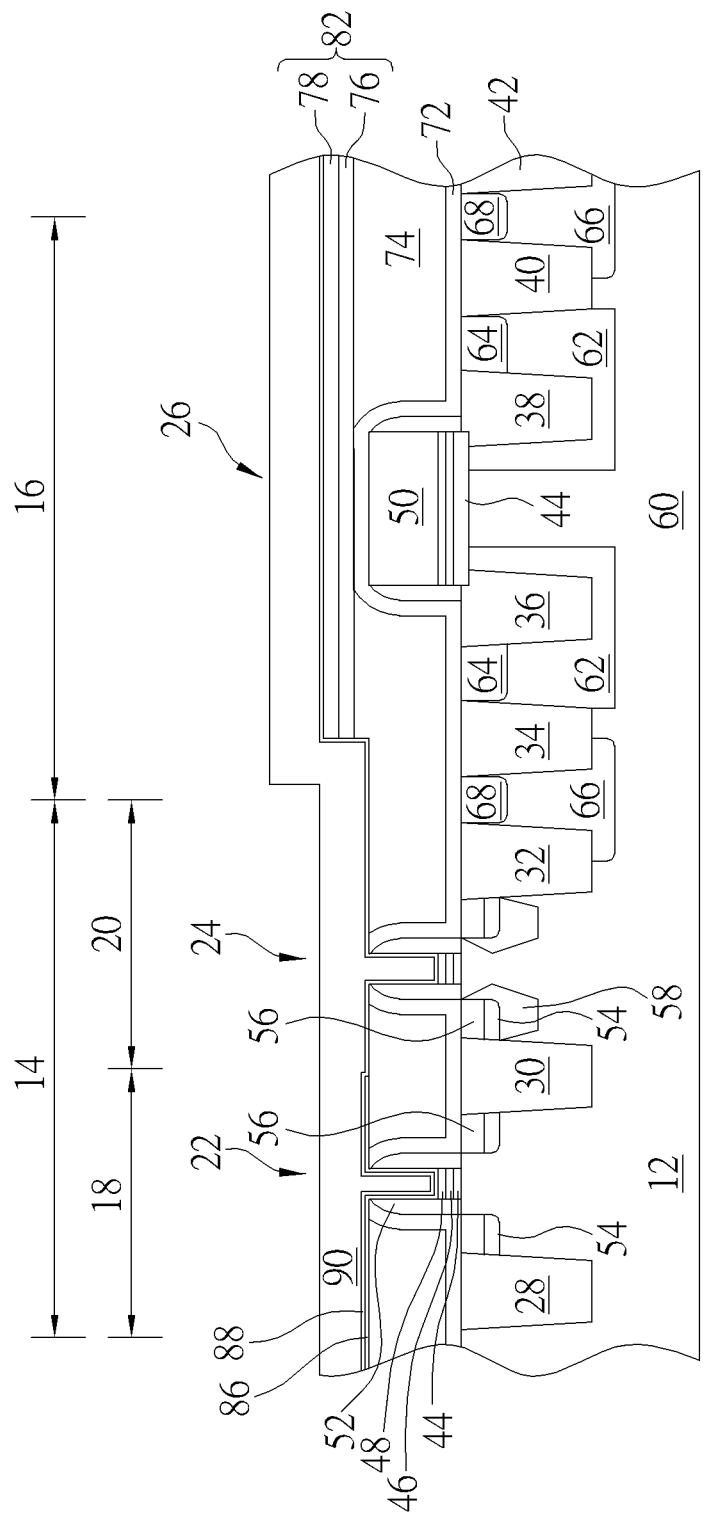
FIG. 3 illustrates a process for fabricating a semiconductor device following FIG. 2.

Next, as shown in FIG. 3, a n-type work function layer 86 and a p-type work function layer 88 are deposited on the NMOS region 18 and PMOS region 20. For instance, a n-type work function layer 86 is deposited into the recesses 84, on the ILD layer 74 and on the patterned hard mask 82, and an etching process is carried out to remove the n-type work function layer 86 on the PMOS region 20 and HV region 16. Preferably, the n-type work function layer 86 has a work function ranging between 3.9 eV and 4.3 eV and may be selected from a group consisting of titanium aluminide (TiAl), zirconium aluminide (ZrAl), tungsten aluminide (WAl), tantalum aluminide (TaAl), and hafnium aluminide (HfAl), but not limited thereto.

Next, a p-type work function layer 88 is deposited on the n-type work function layer 86 of NMOS region 18 and the patterned hard mask 82 on HV region 16 and filled into the recesses 84 of both NMOS region 18 and PMOS region 20. Preferably, the p-type work function layer 88 has a work function ranging between 4.8 eV and 5.2 eV and may be selected from a group consisting of titanium nitride (TiN), tantalum nitride (TaN), and tantalum carbide (TaC), but not limited thereto. It should be noted that even though the p-type work function layer 88 is deposited on both NMOS region 18 and PMOS region 20 in this embodiment, it would also be desirable to conduct an extra etching process to remove the p-type work function layer 88 outside the PMOS region 20, which is also within the scope of the present invention.

Next, a low resistance metal layer 90 is deposited on the p-type work function layer 88 of the NMOS region 18 and PMOS region 20. Preferably, the low resistance metal layer 90 is selected from a group consisting of Al, Ti, Ta, W, Nb, Mo, Cu, TiN, TiC, TaN, Ti/W, TiAl, CoWP, and composite metal such as Ti/TiN, but not limited thereto.

Figure 4:
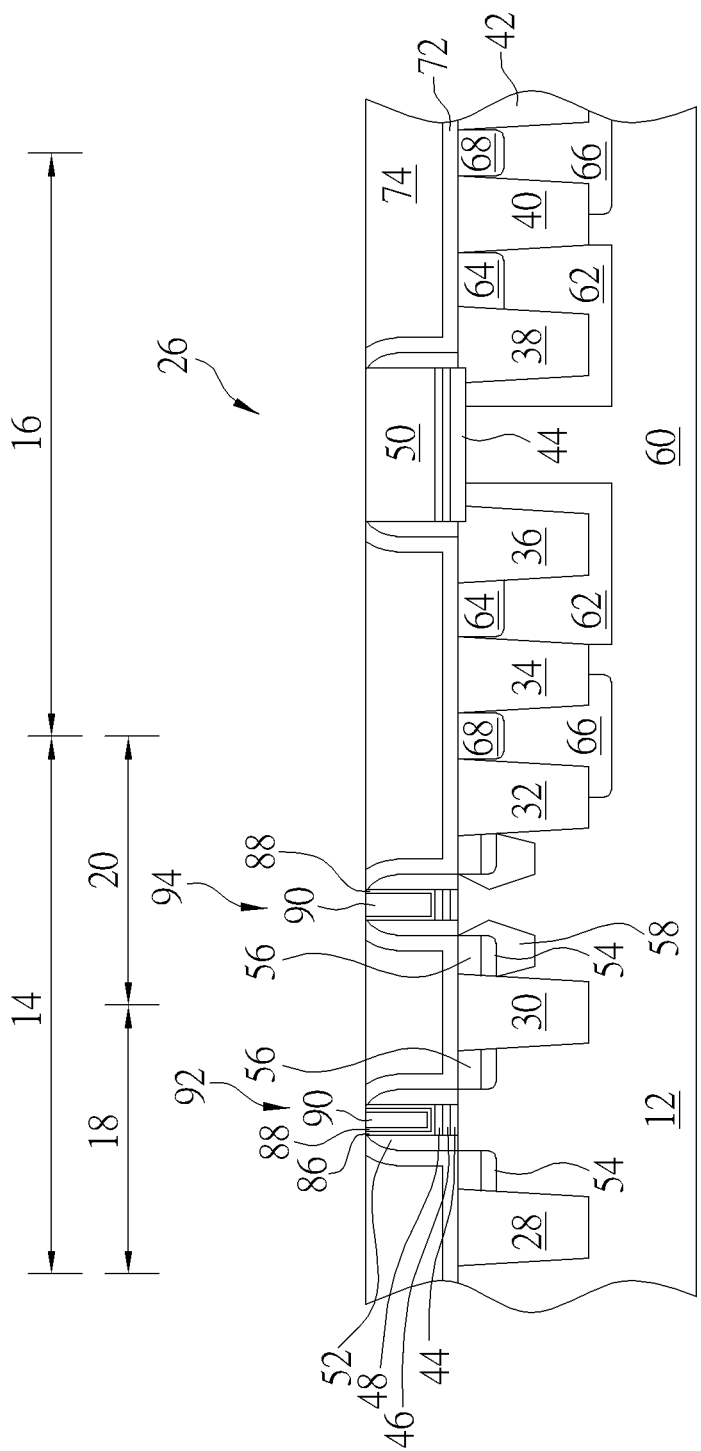
FIG. 4 illustrates a process for fabricating a semiconductor device following FIG. 3.

After the low resistance metal layer 90 is deposited, as shown in FIG. 4, a planarizing process such as a CMP process is conducted to planarize the low resistance metal layer 90, the p-type work function layer 88, the n-type work function layer 86, and the patterned hard mask 82 for forming metal gates 92 and 94 on the logic region 14 and gate structure 26 containing polysilicon gate electrode on HV region 16. This completes the fabrication of a metal gate transistor.

In addition, according to an embodiment of the present invention, it would also be desirable to first form a silicide layer (not shown) only on top of the gate electrode 50 of the gate structure 26 on HV region 16, form the CESL 72 and ILD layer 74 on gate structures 22, 24, 26, planarize the ILD layer 74 and CESL 72 to expose the silicide layer, and then use the silicide layer as a patterned hard mask to remove the gate electrodes 50 from NMOS region 18 and PMOS region 20 for forming recesses 84 as shown in FIG. 2. Next, n-type work function layer, p-type work function, and low resistance metal layer are deposited into the recesses according to the manner disclosed in FIG. 3 and on the gate structure 26 with silicide layer disposed thereon, and a CMP process is conducted to remove part of the low resistance metal layer, part of the n-type work function layer, and part of p-type work function layer for forming metal gates on the logic region 14 and gate structure 26 containing polysilicon gate electrode with silicide layer atop on HV region 16. In this embodiment, no extra hard mask such as the patterned hard mask 82 shown in FIG. 2 is required to form atop the silicide layer and after transforming polysilicon gates into metal gates on logic region 14, the top surface of the silicide layer atop the gate electrode 50 on HV region 16 would be even with the top surfaces of the metal gates 92, 94 on logic region 14 and ILD layer 74.

Referring again to FIG. 4, which further illustrates a structural view of a semiconductor device according to a preferred embodiment of the present invention. As shown in FIG. 4, the semiconductor device includes metal gates 92 and 94 on NMOS region 18 and PMOS region 20 respectively and a polysilicon gate structure 26 on the HV region 16.

On the HV region 16, STIs 34, 36, 38, 40 are formed in the substrate 12 adjacent to two sides of the gate structure 26 and STIs 36 and 38 are disposed under part of the gate structure 26, a p-well 60 is formed in the substrate 12, n-type regions 62 are formed in the substrate 12 under the gate structure 26 and the STIs 36 and 38, n+ regions 64 are formed in and surrounded by the n-type regions 62 and between STIs 36 and 38 and STIs 34 and 40, p-type regions 66 are formed between STIs 34, 40 and STIs 32, 42 and p+ regions 68 are formed in the p-type regions 66 and between STIs 34, 40 and STIs 32, 42. Preferably, the gate structure 26 on the HV region 16 is composed of a gate dielectric layer 44, a high-k dielectric layer 46, a BBM layer 48, and a gate electrode 50 composed of polysilicon, in which a portion of the gate dielectric layer 44 is under the surface of the substrate 12 while another portion of the gate dielectric layer 44 is above the surface of the substrate 12.

On the logic region 14, metal gates 92 and 94 are disposed on each of the MMOS region 18 and PMOS region 20 and a spacer 52 is disposed adjacent to each of the metal gates 92 and 94. Preferably, the metal gate 92 on the NMOS region 18 is composed of a gate dielectric layer 44, a high-k dielectric layer 46, a BBM layer 48, a U-shaped n-type work function layer 86, a U-shaped p-type work function layer 88, and a low resistance metal layer 90. The metal gate 94 on the PMOS region 20 on the other hand is composed of a gate dielectric layer 44, a high-k dielectric layer 46, a BBM layer 48, a U-shaped p-type work function layer 88, and a low resistance metal layer 90. Preferably, the thickness of the gate dielectric layer 44 on the HV region 16 is greater than the thickness of the gate dielectric layers 44 on the logic region 14. It should be noted that even though a n-type work function layer 86 and a p-type work function layer 88 are disposed on the NMOS region 18 while only a single p-type work function layer 88 is disposed on the PMOS region 20, the quantity and combination of the work function layers disposed on NMOS region 18 and PMOS region 20 could all be adjusted according to the demand of the product.

A CESL 72 is disposed on both the logic region 14 and the HV region 16 and adjacent to the sidewalls of the metal gates 92, 94 and gate structure 26, and a ILD layer 74 is disposed on the CESL 72, in which the top surfaces of the ILD layer 74, the CESL 72, the metal gates 92 and 94, and the gate structure 26 are coplanar.

Overall, the present invention discloses an approach of integrating high-k metal gates with high-voltage device by first forming polysilicon gate structures on both logic region and HV region, forming an ILD on and around the polysilicon gate structures, forming a patterned hard mask on the HV region, using the patterned hard mask to remove polysilicon gate structures on the logic region, and depositing work function metal layers and low resistance metal layer in the logic region to form metal gates. Consequently, metal gates are fabricated on the logic region while polysilicon gate is remained on the HV region due to the protection of patterned hard mask.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    providing a substrate having a logic region and high-voltage (HV) region;
    forming a first gate structure and a first gate dielectric layer on the logic region and a second gate structure and a second gate dielectric layer on the HV region, wherein a thickness of the second gate dielectric layer is greater than a thickness of the first gate dielectric layer;
    forming a contact etch stop layer (CESL) on the first gate structure and the second gate structure;
    forming an interlayer dielectric (ILD) layer around the first gate structure and the second gate structure and on the CESL;
    forming a patterned hard mask on the HV region while the CESL is on top of the first gate structure, wherein the patterned hard mask comprises a buffer layer and a cap layer;
    using the patterned hard mask to remove the CESL on the first gate structure; and
    transforming the first gate structure into a metal gate.

2. The method of claim 1, wherein the first gate structure and the second gate structure comprise polysilicon.

3. The method of claim 1, further comprising:
    forming the ILD layer on the CESL;
    planarizing the ILD layer;
    forming the buffer layer on the ILD layer;
    forming the cap layer on the buffer layer;
    patterning the cap layer and the buffer layer to form the patterned hard mask;
    using the patterned hard mask to remove the CESL on the first gate structure;
    using the patterned hard mask to remove a gate electrode of the first gate structure for forming a recess; and
    forming a work function metal layer and a low resistance metal layer into the recess for forming the metal gate.

4. The method of claim 3, further comprising planarizing the ILD layer so that the top surfaces of the ILD layer and the CESL are coplanar.

5. The method of claim 3, further comprising:
    forming the work function metal layer and the low resistance metal layer into the recess and on the patterned hard mask; and
    planarizing the work function metal layer, the low resistance metal layer, and the patterned hard mask.

6. The method of claim 3, wherein the buffer layer and the cap layer comprise different material.

* * * * *